United States Patent
Han

(10) Patent No.: US 10,073,757 B2
(45) Date of Patent: Sep. 11, 2018

(54) SYSTEM AND METHOD FOR CONTROLLING COMPUTER PERFORMANCE

(71) Applicant: EVGA CORPORATION, New Taipei (TW)

(72) Inventor: Tai-Sheng Han, New Taipei (TW)

(73) Assignee: EVGA CORPORATION, New Taipei (TW)

(*) Notice: Subject to any disclaimer, the term of this patent is extended or adjusted under 35 U.S.C. 154(b) by 118 days.

(21) Appl. No.: 15/203,799

(22) Filed: Jul. 7, 2016

(65) Prior Publication Data

US 2017/0262354 A1    Sep. 14, 2017

(30) Foreign Application Priority Data

Mar. 14, 2016 (TW) .............................. 105203484 U

(51) Int. Cl.

| G06F 11/00 | (2006.01) |
|---|---|
| G06F 11/34 | (2006.01) |
| G06F 11/32 | (2006.01) |
| G06F 11/30 | (2006.01) |
| G11C 7/10 | (2006.01) |
| G06F 1/32 | (2006.01) |

(52) U.S. Cl.
CPC .......... *G06F 11/3485* (2013.01); *G06F 1/324* (2013.01); *G06F 1/3206* (2013.01); *G06F 1/3234* (2013.01); *G06F 1/3296* (2013.01); *G06F 11/3024* (2013.01); *G06F 11/3037* (2013.01); *G06F 11/32* (2013.01); *G06F 11/327* (2013.01); *G06F 11/3409* (2013.01); *G11C 7/1072* (2013.01)

(58) Field of Classification Search
CPC ... G06F 11/3485; G06F 11/3409; G06F 11/32
See application file for complete search history.

(56) References Cited

U.S. PATENT DOCUMENTS

| 9,626,307 | B2* | 4/2017 | Kim | G06F 13/102 |
|---|---|---|---|---|
| 2007/0174650 | A1* | 7/2007 | Won | G06F 1/206 |
| | | | | 713/600 |
| 2009/0037759 | A1* | 2/2009 | Lagnado | G06F 1/12 |
| | | | | 713/501 |
| 2010/0058048 | A1* | 3/2010 | Gotcher | G06F 9/44505 |
| | | | | 713/100 |

(Continued)

Primary Examiner — Charles Ehne
(74) Attorney, Agent, or Firm — Leong C. Lei

(57) ABSTRACT

The computer performance control system includes a performance management unit, a performance integration unit, and an activation unit. A user initiates the activation unit through keyboard and the activation unit activates the performance management unit and the performance integration unit simultaneously. The performance management unit displays the operation statuses of the hardware parts of the computer, and provides a number of modes for a user to set operation frequencies of the hardware parts. The performance integration unit executes a performance integration parameter corresponding a selected mode so as to adjust the performance of the computer. As such, a user can conveniently adjust the performance of the CPU, GPU, and RAM of a multi-tasking computer simultaneously and synchronously through some simple key strokes.

8 Claims, 6 Drawing Sheets

(56) References Cited

U.S. PATENT DOCUMENTS

| | | | |
|---|---|---|---|
| 2012/0266008 A1* | 10/2012 | Coteus | G06F 1/10 713/400 |
| 2012/0297232 A1* | 11/2012 | Bircher | G06F 1/324 713/500 |
| 2014/0089700 A1* | 3/2014 | Chang | G06F 9/5094 713/322 |
| 2016/0019181 A1* | 1/2016 | Tan | G06F 13/4282 710/300 |

* cited by examiner

SYSTEM AND METHOD FOR CONTROLLING COMPUTER PERFORMANCE

BACKGROUND OF THE INVENTION (a) Technical Field of the Invention

The present invention is generally related to computer performance management, and more particular to a system and a related method for controlling computer performance in a multi-tasking operating system.

(b) Description of the Prior Art

The manual adjustment of increasing the operation frequency of Central Processing Unit (CPU) or Graphic Processing Unit (GPU) is generally referred to as Overclocking. Conventionally, Overclocking of a computer is achieved by adjusting BIOS frequency settings when the computer is booted up, and rebooting the computer after adjustment. Alternatively, some jumpers on the computer's motherboard are re-configured to achieve Overclocking. As the operation frequency is increased, the loading to the CPU or GPU, including its voltage and current, would increase as well. Therefore, Overclocking may lead to overloading, thereby damaging the computer The above-described Overclocking process has the following drawbacks.

Firstly, using BIOS to Overclocking is tedious. Entering BIOS to adjust settings may be too difficult for inexperienced users. Therefore, not every user can easily accomplish this task. The computer also does provide an interface for user to learn the current operation frequency of the CPU/GPU.

Secondly, jumpers usually have to be set when the computer is assembled. Otherwise, the computer has to be shut down and the casing has to be opened, so that the jumpers can be adjusted. The process is even more tedious. This task is impossible for users not familiar with the computer hardware.

Thirdly, the Overclocking to the CPU and the GPU is usually independent, and cannot be achieved synchronously. Therefore balancing their loading is more difficult.

SUMMARY OF THE INVENTION

Therefore, a major objective of the present invention is to teach a performance control system and method for Overclocking a number of hardware parts of a multi-tasking computer integrally and simultaneously.

The multi-tasking computer performance control system includes a performance management unit installed in a computer. The performance management unit includes a number of configuration modules for adjusting the operation frequencies of a number of corresponding hardware parts of the computer, respectively. The system also includes a performance integration unit data-liked with the performance management unit for providing and executing at least a performance integration parameter that integrates the settings of the configuration modules according to user requirement. Therefore, after the present invention is installed in a multi-tasking computer, a keyboard can be used to initiate an activation unit and the activation unit activates the performance management unit and the performance integration unit simultaneously. The performance management unit displays the operation statuses of the hardware parts of the computer, and provides a number of modes for a user to set operation frequencies of the hardware parts. The performance integration unit executes a performance integration parameter corresponding a selected mode so as to adjust the performance of the computer. In other words, a user can conveniently adjust the performance of the CPU, GPU, and RAM of a multi-tasking computer simultaneously and synchronously through some simple key strokes corresponding to a number of modes. In addition to preset modes such as SuperClock, DownClock, and Normal modes, there are also multiple user-customizable Profile modes so as to fit user requirements under various demands.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
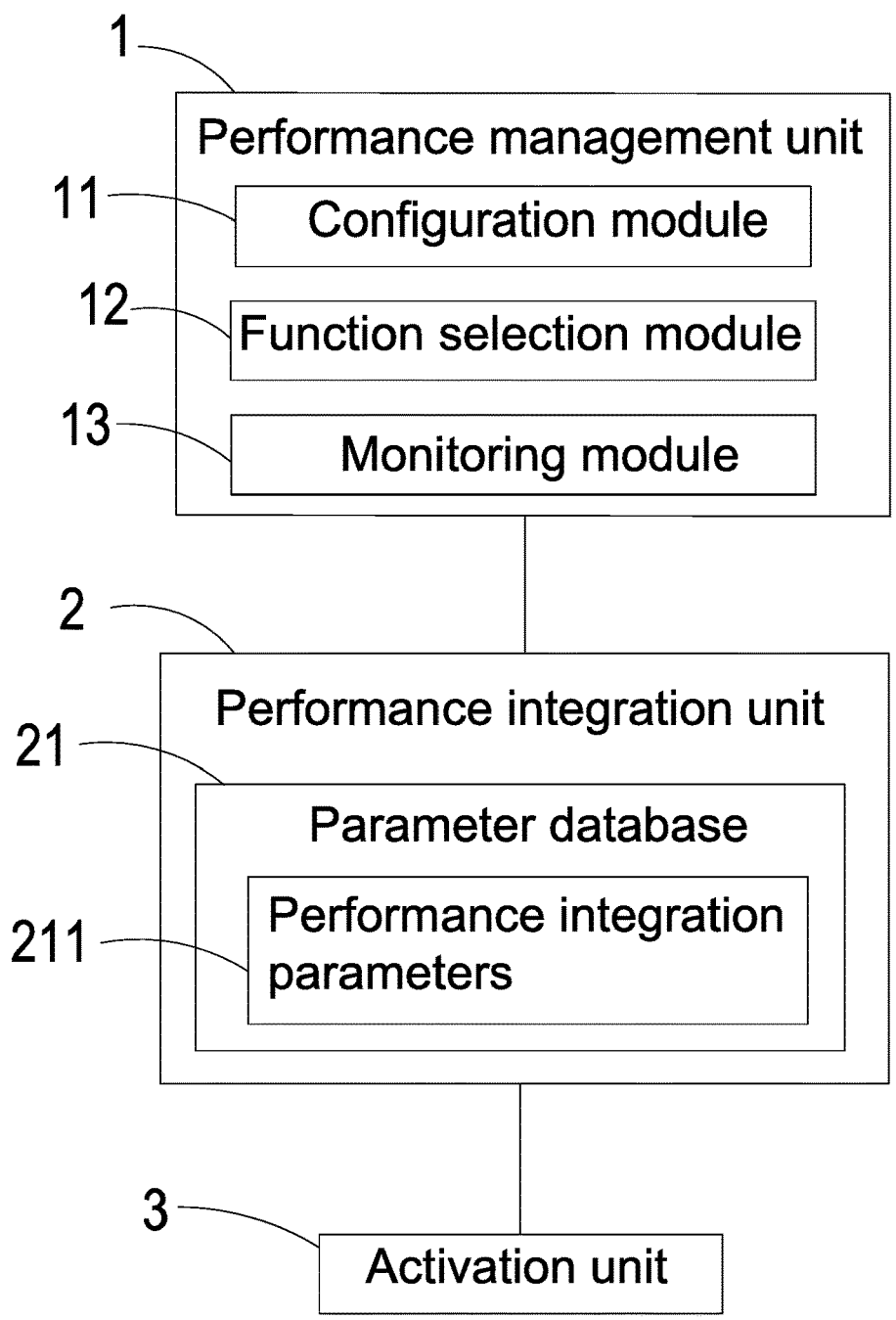
FIG. 1 is a functional block diagram showing a system for controlling computer performance according to an embodiment of the present invention.
Figure 2:
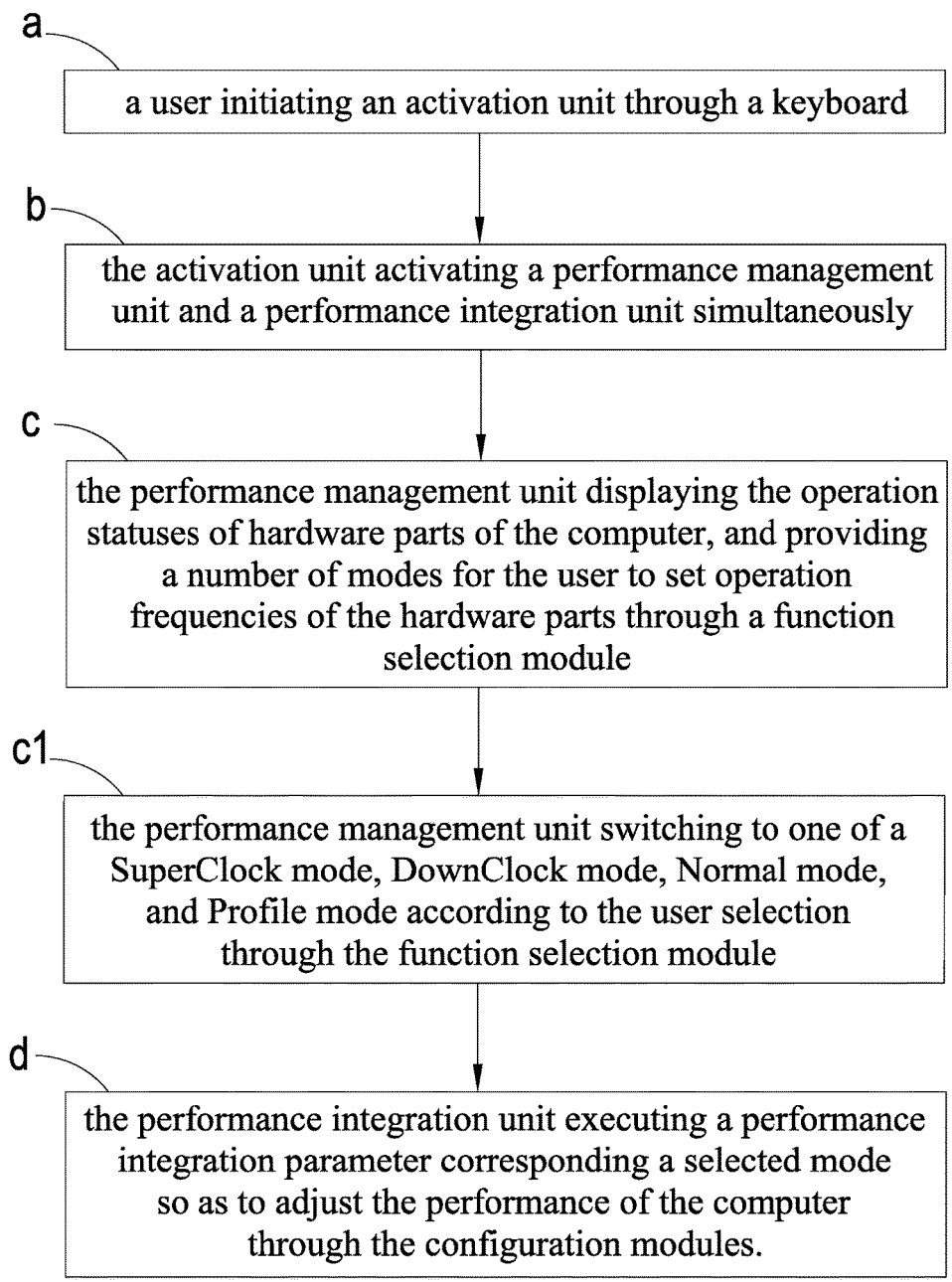
FIG. 2 is a flow diagram showing a method for controlling computer performance according to an embodiment of the present invention.
Figure 3:
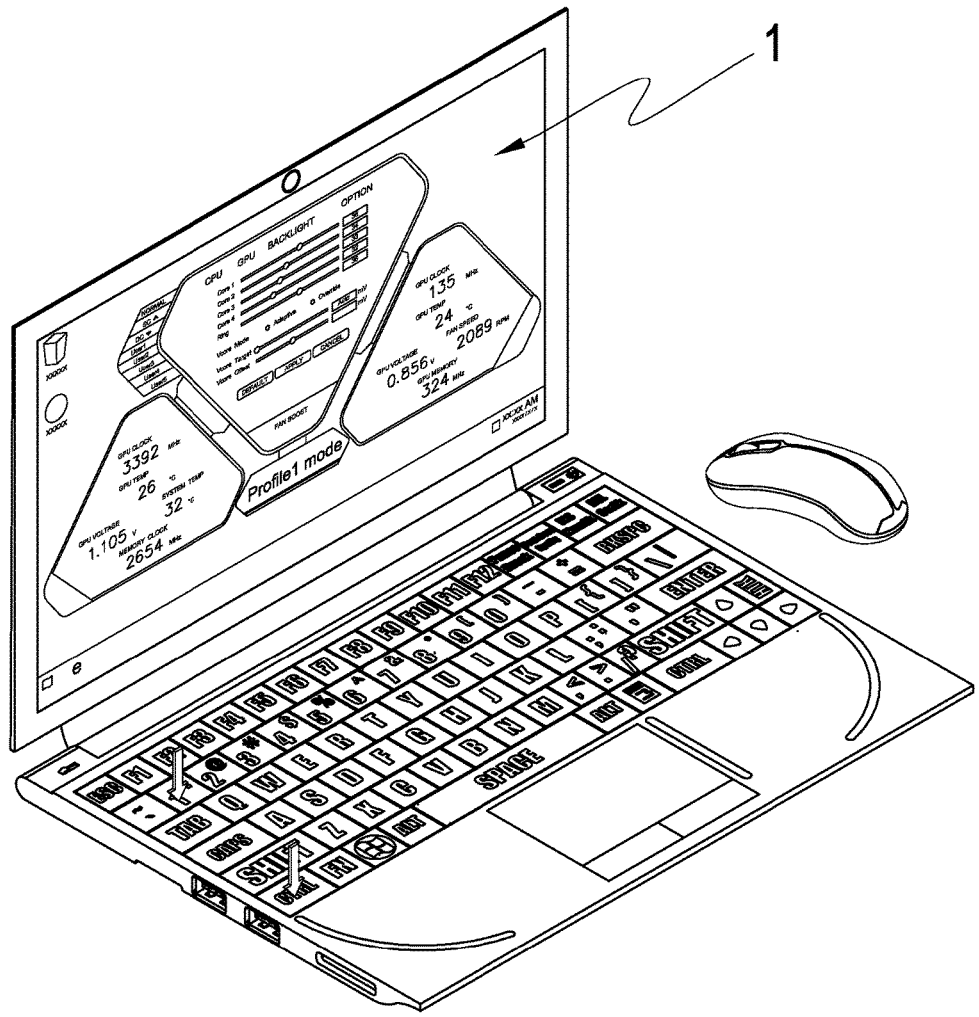
FIG. 3 is a schematic diagram showing an operation scenario of an embodiment of the present invention.

As shown in FIGS. 1 and 2, a multi-tasking computer performance control system according to an embodiment of the present invention includes the following components.

A performance management unit 1 is installed in a computer. The performance management unit 1 includes a number of configuration modules 11 for setting operation frequencies of corresponding hardware parts of the computer, such as Central Processing Unit (CPU), Graphic Processing Unit (GPU), Random Access Memory (RAM), etc. The performance management unit 1 also includes a function selection module 12 for switching among a high-performance SuperClock mode (or OverClock mode), an energy-saving DownClock mode, a Normal mode, and a user-customizable Profile mode. The performance management unit 1 further includes a monitoring module 13 for presenting the operation statuses of the controlled hardware parts such as the CPU, GPU, and RAM.

A performance integration unit 2 is data-linked with the performance management unit 1 for providing and executing at least a performance integration parameter 211 that integrates the settings of the above configuration modules 11 according to user requirement. The performance integration unit 2 includes a parameter database 21 for storing the performance integration parameters 211.

An activation unit 3 is electrically linked with the performance integration unit 2 for activating the performance integration unit 2, through a peripheral such as a keyboard, to adjust the multi-tasking computer's performance in accordance with a performance integration parameter 211.

A multi-tasking computer performance control method according to an embodiment of the present invention includes the following steps.

In step (a), a user initiates the activation unit 3 through a keyboard or other peripheral.

In step (b), the activation unit 3 activates the performance management unit 1 and the performance integration unit 2 simultaneously.

In step (c), the performance management unit 1 displays the operation statuses of a number of hardware parts, and allows the user to set operation frequencies of the hardware parts through the function selection module 12.

In step (c1), the performance management unit 1 switches to one of the SuperClock mode, DownClock mode, Normal mode, and Profile mode according to the user selection through the function selection module 12.

In step (d), the performance integration unit 2 executes a performance integration parameter 211 so as to adjust the performance of the multi-tasking computer through the configuration modules 11.

Figure 4:
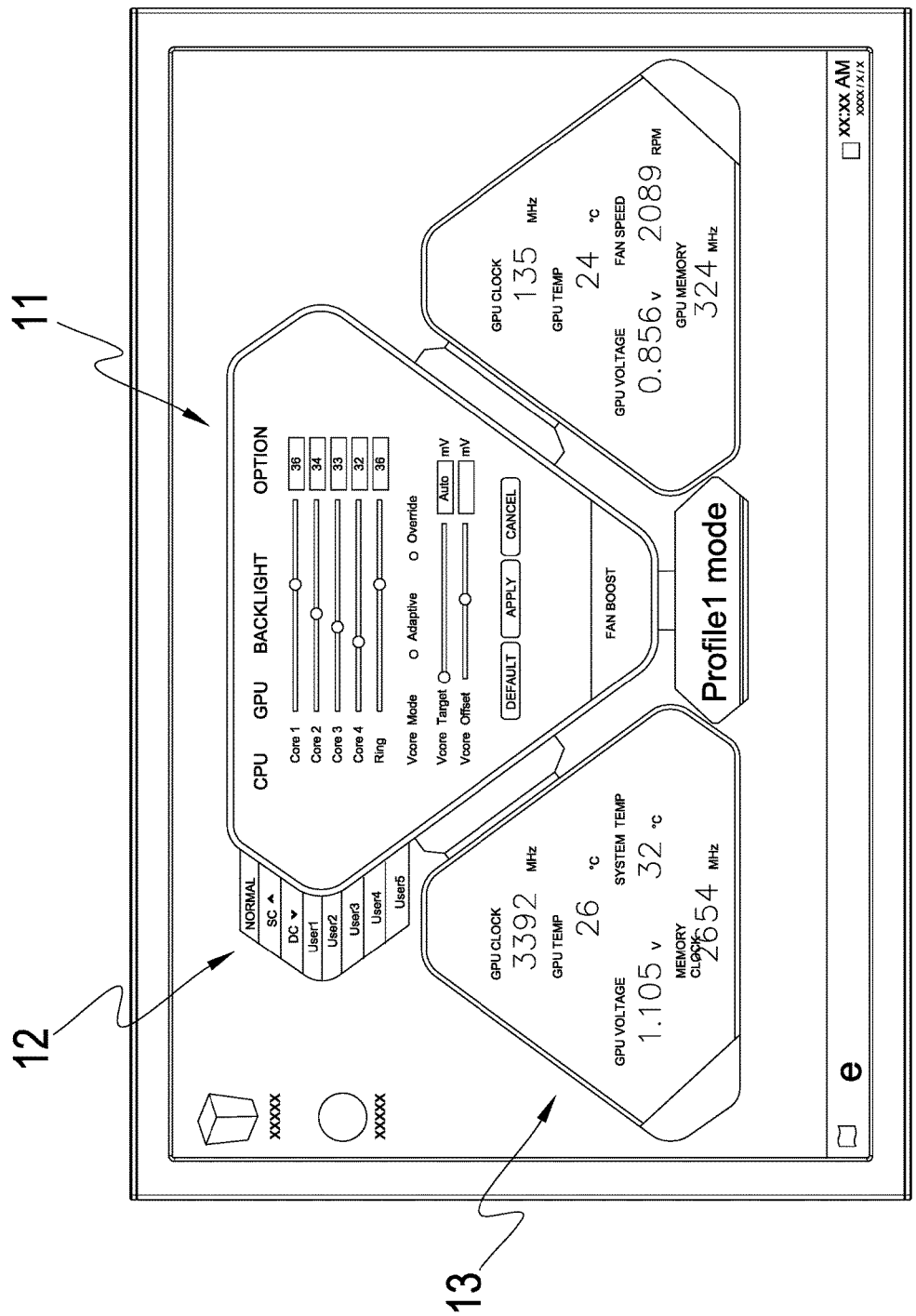
FIG. 4 is a schematic diagram showing another operation scenario of an embodiment of the present invention.

As shown in FIGS. 1 to 4, after the present invention is installed in a multi-tasking computer, a shortcut key on a keyboard can initiate the activation unit 3 and the activation unit 3 activates the performance management unit 1 and the performance integration unit 2 simultaneously. As shown in FIG. 4, an interface of the performance management unit 1 indicates that the performance management unit 1 includes a function selection module 12 and at least a monitoring module 13. The monitoring modules 13 display the current operation statuses of the CPU, GPU, and RAM, including their respective temperatures, frequencies, voltages, etc. for user observation. Depending on the shortcut keys a user operates, the function selection module 12 triggers a corresponding mode. In FIG. 4, the user picks the Profile mode named Profile1. Under this mode, the user is able to determine which hardware parts' operation frequencies to adjust and to what values, and conducts these adjustments through the configuration modules 11. These adjustments are also recorded in a performance integration parameter 211 stored in the parameter database 21. Subsequently, the performance integration unit 2 can execute this parameter so as to complete the same adjustments without going through the configuration process again. As described above, the present invention therefore allows the Overclocking to the CPU, GPU, and RAM in a multi-tasking computer simultaneously and integrally, and their operation statuses can be observed in real-time.

Figure 5:
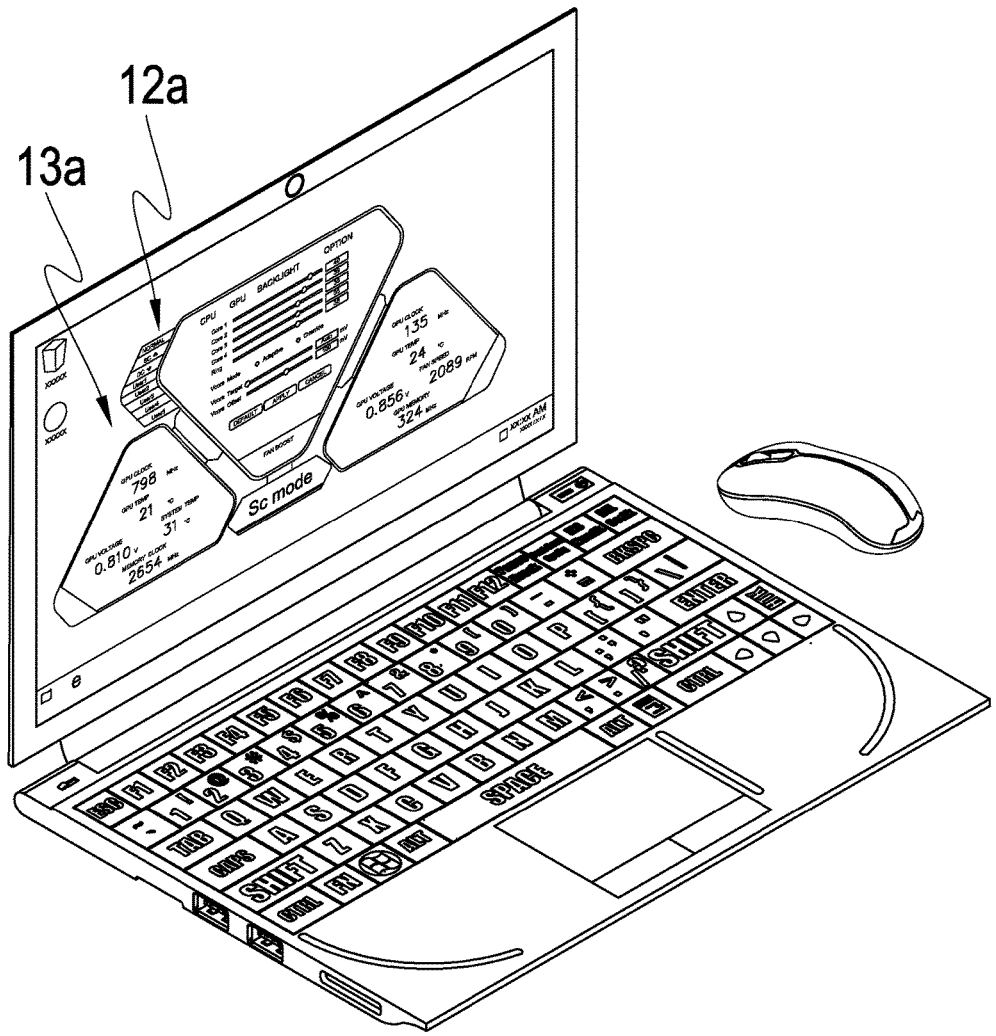
FIG. 5 is a schematic diagram showing another operation scenario of an embodiment of the present invention.

As shown in FIG. 5, in this scenario, the user picks the SuperClock or OverClock mode through the function selection module 12a. The SuperClock or OverClock mode is a preset mode and a corresponding performance integration parameter 211 is already built in the parameter database 21. Therefore, the performance integration unit 2 automatically executes the corresponding performance integration parameter 211 and completes the frequency adjustments through the configuration modules 11 without user involvement.

Figure 6:
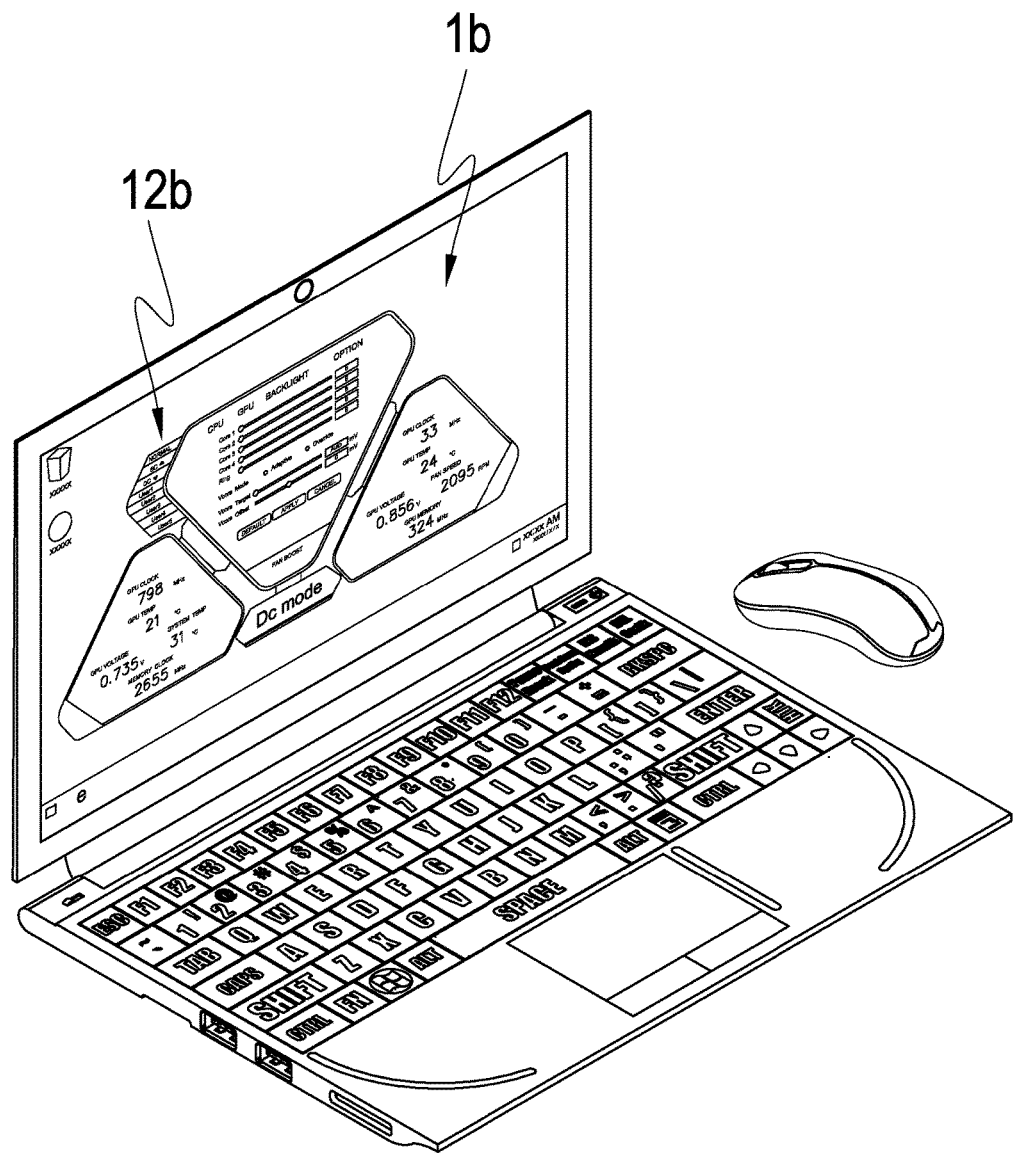
FIG. 6 is a schematic diagram showing another operation scenario of an embodiment of the present invention.

As shown in FIG. 6, in this scenario, the user picks the DownClock mode through the function selection module 12b. The DownClock mode is also a preset mode and a corresponding performance integration parameter 211 is already built in the parameter database 21. Therefore, the performance integration unit 2 automatically executes the corresponding performance integration parameter 211 and completes the frequency adjustments through the configuration modules 11 without user involvement. This mode is specifically provided to reduce the multi-tasking computer's power consumption when, for example, the computer draws its electricity from a battery.

In order to reduce power consumption, when the multi-tasking computer is switched from being powered by an external source (e.g., AC mains) to being powered by an internal source (e.g., built-in battery), the performance management unit 1b automatically switches to the DownClock mode. When the multi-tasking computer is switched back to being powered by the external source, the performance management unit 1b automatically switches to a previous mode (e.g., SuperClock mode) before the DownClock mode.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. A performance control system of a multi-tasking computer, comprising:

a performance management unit comprising a plurality of configuration modules for adjusting the operation frequencies of a plurality of corresponding hardware parts of the computer, respectively, and a function selection module providing selections among at least a SuperClock mode, a DownClock mode, a Normal mode, and a Profile mode;

a performance integration unit data-linked with the performance management unit for providing and executing at least a performance integration parameter, where the performance integration unit comprises a parameter database for storing a plurality of performance integration parameters, each integrating the settings of the configuration modules according to user requirement; and an activation unit electrically linked with the performance integration unit for activating the performance integration unit to adjust the computer's performance in accordance with a performance integration parameter, where the activation unit is initiated by a shortcut key on a keyboard connecting the multi-tasking computer, and the activation unit activates the performance management unit and the performance integration unit simultaneously.

2. The performance control system according to claim 1, wherein the configuration modules are for adjusting the operation frequencies of at least a Central Processing Unit (CPU), a Graphic Processing Unit (GPU), and Random Access Memory (RAM), respectively.

3. The performance control system according to claim 2, wherein the performance management unit comprises at least a monitoring module displaying an operation status of one of the CPU, GPU, and RAM.

4. A performance control method of a multi-tasking computer, comprising the steps of:
(a) a user initiating an activation unit through a shortcut key on a keyboard of the computer;
(b) the activation unit activating a performance management unit and a performance integration unit simultaneously;
(c) the performance management unit displaying the operation statuses of a plurality of hardware parts of the computer, and providing a plurality of modes for a user to set operation frequencies of the hardware parts through a function selection module; and
(d) the performance integration unit executing a performance integration parameter corresponding a selected mode so as to adjust the performance of the computer through the configuration modules.

5. The performance control method according to claim 4, wherein the performance integration parameter is stored in a parameter database for the performance integration unit to access.

6. The performance control method according to claim 4, further comprising a step (c1) the performance management unit, through the function selection module, switching to one of at least a SuperClock mode, a DownClock mode, a Normal mode, and a Profile mode.

7. The performance control method according to claim 4, wherein the configuration modules are for adjusting the operation frequencies of at least a Central Processing Unit (CPU), a Graphic Processing Unit (GPU), and Random Access Memory (RANI), respectively.

8. The performance control method according to claim 7, wherein the performance management unit comprises at least a monitoring module displaying an operation status of one of the CPU, GPU, and RAM.

* * * * *